US007418124B2

(12) United States Patent
Peterson et al.

(10) Patent No.: US 7,418,124 B2
(45) Date of Patent: Aug. 26, 2008

(54) QUALIFYING PATTERNS, PATTERNING PROCESSES, OR PATTERNING APPARATUS IN THE FABRICATION OF MICROLITHOGRAPHIC PATTERNS

(75) Inventors: Ingrid B. Peterson, Menlo Park, CA (US); Mike Von den Hoff, Munich (DE); Jim Wiley, Menlo Park, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 868 days.

(21) Appl. No.: 10/619,943

(22) Filed: Jul. 15, 2003

(65) Prior Publication Data

US 2004/0091142 A1     May 13, 2004

Related U.S. Application Data

(60) Provisional application No. 60/485,233, filed on Jul. 7, 2003, provisional application No. 60/396,197, filed on Jul. 15, 2002.

(51) Int. Cl.
*G06K 9/00* (2006.01)
*H04N 7/18* (2006.01)
*G02B 21/06* (2006.01)
*G06F 17/50* (2006.01)

(52) U.S. Cl. .................. 382/144; 348/131; 359/385; 703/13

(58) Field of Classification Search ................ 382/141, 382/145, 144; 348/131; 359/385; 703/13
See application file for complete search history.

(56) References Cited

U.S. PATENT DOCUMENTS 4,578,810 A * 3/1986 MacFarlane et al. ........ 382/147
5,046,109 A * 9/1991 Fujimori et al. ............ 382/144
5,444,480 A * 8/1995 Sumita ...................... 348/127

(Continued)

FOREIGN PATENT DOCUMENTS

EP         1 093 017        4/2001

(Continued)

OTHER PUBLICATIONS

Allan et al, Critical Area Extraction for Soft Fault Estimation, Feb. 1998, IEEE, vol. II, No. I, p. 1-3.*

(Continued)

*Primary Examiner*—Bhavesh Mehta
*Assistant Examiner*—Kathleen S Yuan
(74) *Attorney, Agent, or Firm*—Baker & McKenzie LLP

(57) ABSTRACT

Methods that include acquiring aerial images of a reticle for different values of a member of a set of lithographic variables are provided. One method also includes determining a presence of an anomaly in a design pattern of the reticle by comparing at least one pair of the aerial images corresponding to at least two of the different values. A different method includes comparing at least one pair of the aerial images corresponding to at least two of the different values and determining an area on the reticle where a lithography process using the reticle is most susceptible to failure based on the results of the comparison. Another embodiment includes determining a presence of transient repeating defects on the reticle by subtracting non-transient defects from the aerial images and comparing at least one pair of the aerial images corresponding to at least two of the different values.

24 Claims, 12 Drawing Sheets

U.S. PATENT DOCUMENTS

| | | | |
|---|---|---|---|
| 5,932,377 A * | 8/1999 | Ferguson et al. | 430/5 |
| 5,965,306 A | 10/1999 | Mansfield et al. | |
| 6,091,846 A * | 7/2000 | Lin et al. | 382/145 |
| 6,171,737 B1 | 1/2001 | Phan et al. | |
| 6,268,093 B1 | 7/2001 | Kenan et al. | |
| 6,373,975 B1 | 4/2002 | Bula et al. | |
| 6,665,065 B1 * | 12/2003 | Phan et al. | 356/237.1 |
| 6,701,004 B1 * | 3/2004 | Shykind et al. | 382/149 |
| 6,757,645 B2 * | 6/2004 | Chang et al. | 703/13 |
| 6,902,855 B2 | 6/2005 | Peterson et al. | |
| 7,133,548 B2 * | 11/2006 | Kenan et al. | 382/144 |
| 2002/0181756 A1 * | 12/2002 | Shibuya et al. | 382/145 |

FOREIGN PATENT DOCUMENTS

WO      00/36525      6/2000

OTHER PUBLICATIONS

Budd et al., "A New Mask Evaluation Tool, the Microlithography Simulation Microscope Aerial Image Measurement System," SPIE vol. 2197, 1994, pp. 530-540.

Schurz et al., "Simulation Study of Reticle Enhancement Technology Applications for 157 nm Lithography," SPIE vol. 4562, 2002, pp. 902-913.

Martino et al., "Application of the Aerial Image Measurement System (AIMS™) to the Analysis of Binary Mask Imaging and Resolution Enhancement Techniques," SPIE vol. 2197, 1994, pp. 573-584.

International Search Report, application No. PCT/US03/21907, mailed Jun. 7, 2004.

Sahouria et al., "Full-chip Process Simulation for Silicon DRC," Mentor Graphics, Mar. 2000, 6 pages.

Granik et al., "Sub-resolution process windows and yield estimation technique based on detailed full-chip CD simulation," Mentor Graphics, Sep. 2000, 5 pages.

* cited by examiner

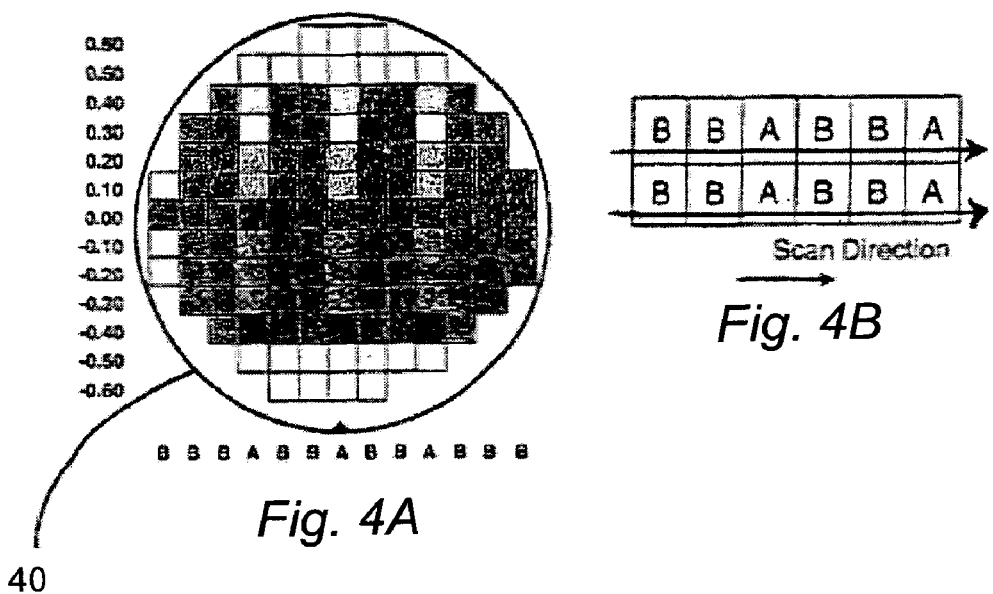
Fig. 4A
Fig. 4B
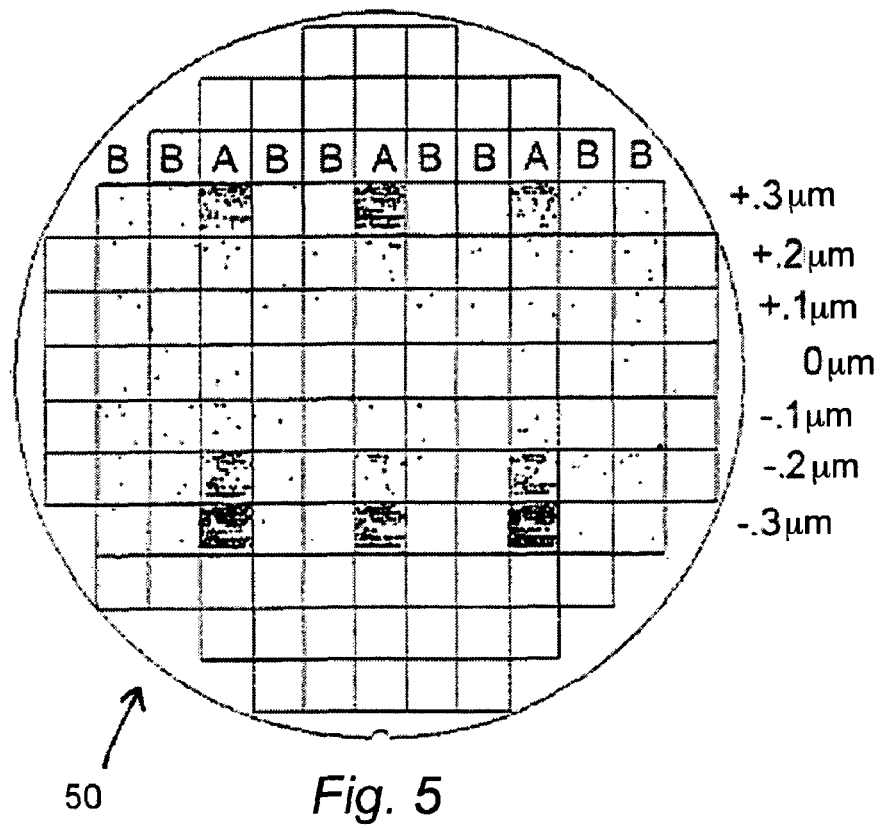
Fig. 5

QUALIFYING PATTERNS, PATTERNING PROCESSES, OR PATTERNING APPARATUS IN THE FABRICATION OF MICROLITHOGRAPHIC PATTERNS

PRIORITY CLAIM

This application claims priority to U.S. Provisional Application No. 60/396,197 entitled "Qualifying Patterns, Patterning Processes, or Patterning Apparatus in the Fabrication of Microlithographic Patterns," filed Jul. 15, 2002, which is incorporated by reference as if fully set forth herein. This application also claims priority to U.S. Provisional Application No. 60/485,233 entitled "Qualifying Patterns, Patterning Processes, or Patterning Apparatus in the Fabrication of Microlithographic Patterns," filed Jul. 7, 2003, which is incorporated by reference as if fully set forth herein.

BACKGROUND OF THE INVENTION

1. Field of the Invention

This invention relates to the manufacture of microelectronic devices and, in particular, to a method of qualifying a pattern, patterning process, or patterning apparatus used in the fabrication of microlithographic patterns for producing microelectronic devices.

2. Description of the Related Art

The rapid decrease in $k_1$ (line-width=$k_1$ ($\lambda$/NA)) in lithographic manufacture of semiconductor devices has necessitated the use of Resolution Enhancement Techniques (RET). These RET include, but are not limited to, Optical Proximity Corrections (OPC), Phase Shift Masks (PSM), and assist bar corrections. Although they are implemented in semiconductor device designs to facilitate low $k_1$ lithography, these RET make reticles more difficult and consequently more expensive to manufacture.

Semiconductor device design and reticle manufacturing quality are verified by different procedures before the reticle enters a semiconductor fabrication facility to begin production of integrated circuits. The semiconductor device design is checked by software simulation to verify that all features print correctly after lithography in manufacturing. The reticle is inspected at the mask shop for reticle defects and measured to ensure that the features are within specification. Marginal RET designs not noted by simulation checks translate into electrical failures in wafer fabrication, affect yield, and possibly remain unnoticed until wafer fabrication is complete.

Traditional methods employed in the inspection of complex mask patterns place tremendous demand on reticle inspection tools. One technique for performing image qualification entails using focus exposure matrix techniques. Performing an inspection of a conventional focus exposure matrix introduces a complication in that every exposure field is different. Die-to-die comparison is performed between adjacent local exposure fields. Any pattern change that may occur at a defocus position that is physically located farther than one exposure field from the nominal exposure field will not, therefore, be detected as different because the nominal exposure field is no longer factored in the comparison. Moreover, current reticle inspection techniques cannot detect the presence of an error in the design database. Prior art single die reticle inspection entails implementation of a design simulation technique in which a signal derived from an actual reticle is subtracted from a simulated design reference.

What is needed, therefore, is an inspection technique that is effective in locating pattern anomalies in a single die or a multi-die reticle and detecting reticle design errors resulting from errors in the design data base.

SUMMARY OF THE INVENTION

A method of determining the presence of an anomaly in qualifying a pattern, patterning process, or patterning apparatus used in the fabrication of microlithographic patterns is provided.

A preferred implementation is a method of qualifying incoming reticles and process conditions on test wafers to maximize the available usable process window for a given reticle exposure tool combination. The method qualifies the image produced by the cumulative effect of various configurations of illumination sources, optical proximity correction artifacts, phase shifted imaging, and various photochemical processing techniques implemented at the imaging plane. Practicing this method on test wafers enables the identification of spatial areas where a process will fail first and candidate regions for carrying out defect inspection and metrology.

The nature of process window qualification is to induce pattern anomalies, such as transient repeating defects, by varying a process parameter or operating variable. One example of an operating variable is a lithographic operating variable, such as illumination. Focus of the exposing tool is one typical illumination operating variable. Transient or "soft" repeating defects are defects that print under only specific conditions, such as, for example, defocus level, exposure dose, and photoresist uniformity conditions. The term "soft defects" also refers to defects that are cleanable, unlike "hard defects," in which the pattern is permanently cast in the reticle. The narrowing process window, which is primarily reduced depth of focus, is used to intentionally amplify any unexpected patterning behavior. The method increases the capture rate of pattern anomalies that sometimes depend on coincidental confluence of exposure, focus, illumination, and resolution enhancement technology patterning at the wafer plane.

The process window qualification procedure implements die-to-die inspection of a plurality of dies or other repetitive patterns on a semiconductor wafer or other substrate on which design patterns are printed by photoresist patterning performed in accordance with a lithographic process using either a single die reticle or a multi-die reticle. The procedure entails selecting an illumination operating variable to modulate. Members of a set of possible illumination operating variables include illumination focus, illumination exposure, partial coherence of illumination, mode of illumination, and numerical aperture. A layer of pattern recording material such as a photoresist covering a test wafer substrate is exposed in the form of a grid of regions arranged in rows and columns. The columns are arranged in a pattern of "A" columns representing regions exposed to different values of a predetermined operating variable and "B" columns representing regions exposed to a common reference value of the predetermined operating variable. Conventional inspection techniques identifying differences in the "A" regions compared with the "B" regions eliminate hard repetitive anomalies. Comparing differences between "A" region values for a given column relative to a reference value identifies transient repetitive anomalies. Each repetitive anomaly identified is evaluated for critical status. The procedure of comparing images formed by different values of a lithographic operating variable enables qualifying single die reticles and detecting design pattern defects. If the anomaly identified is of a design pattern type, critical status would depend on the number of occurrences and location of the anomaly on the design pattern.

Methods of qualifying masks, reticles, or other patterns characterized by databases on which are stored image data acquired by practice of aerial image measurement system (AIMS) or design rule checking (DRC) techniques are also provided. In the case of AIMS, the stored image data are acquired by processing multiple aerial images of the reticle, and in the case of DRC, the stored image data are acquired by simulation of the reticle design pattern.

According to one embodiment, a method includes acquiring aerial images of a reticle containing a design pattern. The reticle may be a single die reticle or a multi-die reticle. The aerial images are acquired for different values of a member of a set of lithographic variables. The member of the set that is varied may include illumination focus, exposure, degree of partial coherence, illumination mode, or numerical aperture. In one embodiment, the aerial images may be acquired with different detectors having different values. In some embodiments, one of the different values may represent a reference member value. The method also includes determining a presence of an anomaly in the design pattern by comparing at least one pair of the aerial images corresponding to at least two of the different values. In one embodiment, the anomaly may be a design pattern defect. In another embodiment, the anomaly may be a reticle enhancement technique defect. In some embodiments, the anomaly may be a transient repeating defect that will print under only a portion of the different values. In addition, some embodiments of the method may include determining a critical status of the anomaly.

In another embodiment, the method may include inspecting the reticle for other types of anomalies using one of the aerial images. The other types of anomalies may include reticle manufacturing errors and contaminants. Such inspection of the reticle may include a die-to-database comparison or a die-to-die comparison. In an additional embodiment, prior to determining the presence of the anomaly, the method may include preprocessing at least the one pair of aerial images to remove relatively high intensity values and relatively low intensity values from at least the one pair of the aerial images.

In some embodiments, the method may include identifying regions of the reticle for review based on a location of the anomaly. In one such embodiment, the review may include aerial image review at varying levels of optical conditions. In other embodiments, if more than one anomaly is found in the design pattern, the method may include binning the anomalies according to regions of the reticle proximate the anomalies. In yet another embodiment, the method may include determining a process window for a lithography process to be carried out using the reticle. The method may include any other steps of any other methods described herein.

Another embodiment relates to a method that includes acquiring aerial images of a reticle containing a design pattern. The aerial image are acquired for different values of a member of a set of lithographic variables. In some embodiments, one of the different values represents a reference member value. The method also includes comparing at least one pair of the aerial images corresponding to at least two of the different values. In addition, the method includes determining an area on the reticle where a lithography process using the reticle is most susceptible to failure based on results of the comparison. In one embodiment, the area may include anomalies that are common to at least one pair of the aerial images not acquired at the reference member value and that are not common to the aerial image acquired at the reference member value. The method may include any other steps of any other methods described herein.

An additional embodiment relates to a method that includes inspecting a reticle containing a design pattern for non-transient defects. The non-transient defects may include defects such as reticle manufacturing errors and/or contaminants on the reticle. The inspection may be a "conventional reticle inspection." For example, in one embodiment, inspecting the reticle may include aerial imaging of the reticle at a reference member value of the set of the lithographic variables. In a different embodiment, inspecting the reticle may be performed using a non-aerial imaging reticle inspection system. In either embodiment, inspecting the reticle may include a die-to-database comparison or a die-to-die comparison. The type of comparison that is used for the inspection may depend on the type of reticle being inspected as described further herein.

This method also includes acquiring aerial images of the reticle for different values of a member of a set of lithographic variables. In some embodiments, the inspection of the reticle and acquiring the aerial images may be performed substantially simultaneously particularly if the "conventional reticle inspection" includes aerial imaging. In addition, the method includes determining a presence of transient repeating defects on the reticle by subtracting the non-transient defects from the aerial images and comparing at least one pair of the aerial images corresponding to at least two of the different variables. The method may further include determining a process window for a lithography process to be carried out using the reticle based on the transient repeating defects. Therefore, the method described above may be used to perform a "conventional reticle inspection" and to determine a process window for the lithography process substantially simultaneously. The method may include any other steps of any other methods described herein.

In another embodiment, a method for inspecting a wafer may include determining a presence of transient repeating defects and non-transient defects on a wafer. In some respects, inspection for non-transient defects may be similar to "conventional wafer inspection." In one such embodiment, non-transient defects may be detected by comparing one or more design patterns printed on the wafer at a reference member value of a set of lithographic variables to another design pattern printed on the wafer at the reference member value. In some embodiments, the reference member value may be the best known conditions (e.g., best focus, best dose, best sigma, etc.) for the lithography process. The design pattern may include die on the wafer or portions of die on the wafer. In this manner, non-transient defects may be identified on a wafer using a die-to-die comparison. Alternatively, non-transient defects may be detected by comparing one or more design patterns printed on the wafer at the reference member value to a reference design pattern, which may be stored, for example, in a database. In this manner, non-transient defects may be identified on a wafer using a die-to-database comparison. In one embodiment, the reference design pattern may be a simulated image of the design pattern that would be printed on the wafer at the reference member value. The simulated image may be obtained by simulating an aerial image of the reticle that would be formed at the reference member value and altering the simulated aerial image using a resist model. In another example, the simulated image may be obtained by acquiring an aerial image of the reticle at the reference member value and altering the acquired aerial image using a resist model. In either example, the simulated image may be substantially equivalent to an image that would be printed in the resist on the wafer using the reticle at the reference member value. Therefore, the reference design pattern may represent performance characteristics of the reticle, the resist, and the process parameters.

In addition, transient repeating defects may be found using different design patterns printed on a wafer. The different design patterns may be formed by varying a process parameter or operating variable as described herein. The transient repeating defects may be identified by comparing design patterns formed at different process parameters or operating variables as described herein. For example, the method may include determining a presence of transient repeating defects on the wafer by subtracting the non-transient defects from the design patterns produced by wafer inspection and comparing at least one pair of the design patterns corresponding to at least two of the different variables. In a similar manner, transient repeating defects may be identified by comparing different simulated images that are substantially equivalent to images of the reticle that would be printed on the wafer at different process conditions. The simulated images may be generated as described above.

In the above described method, transient defect detection and non-transient defect detection may be performed substantially simultaneously. The method may further include determining a process window for a lithography process to be carried out using the reticle based on the transient repeating defects. Therefore, the method described above may be used to perform a "conventional wafer inspection" and to determine a process window for the lithography process substantially simultaneously. This method may also include any other steps of any other methods described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which:

FIG. 4A shows a focus-modulated wafer surface printed with a reticle that is to be qualified according to the "BBA" column pattern of FIG. 2;

FIG. 4B is an enlarged view of several contiguous exposure field regions of the wafer surface of FIG. 4A;

FIG. 5 is a diagram of a defect data map of a scanned test wafer;

Figure 1A:
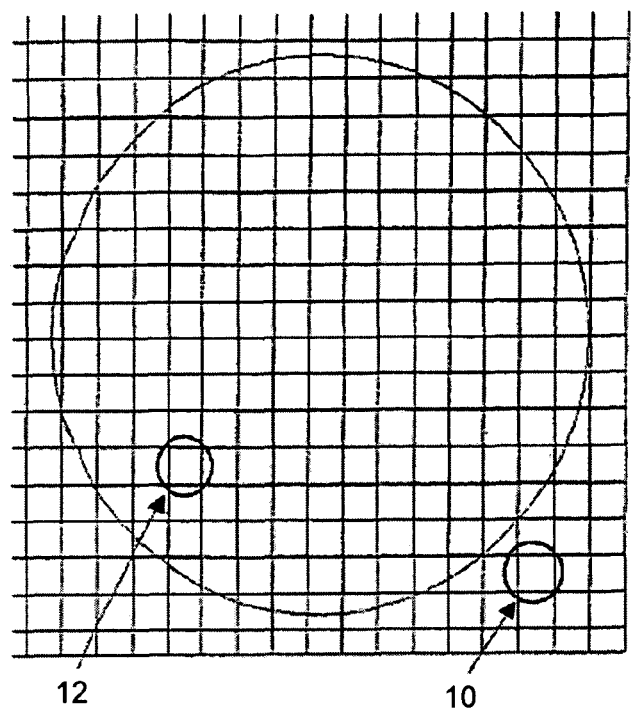
FIGS. 1A and 1B show, respectively, single die reticle and multi-die reticle wafer layouts.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "reticle" is used interchangeably with the term "mask." In addition, the term "defect" is used interchangeably with the term "anomaly."

A preferred embodiment implements modulation of focus of light illuminating reticles, each of which is used to expose by a step and repeat or a step and scan process a top layer of photoresist covering a test wafer. The reticles are printed on optimized film stacks, the type of optimization depending on the type of process level, which includes contact or via, gate, and trench. The base film stack is preferably a simple thermally grown or deposited stack of 1050 Å oxide covered by 320 Å SiON or any other base film stack known in the art.

Figure 1B:
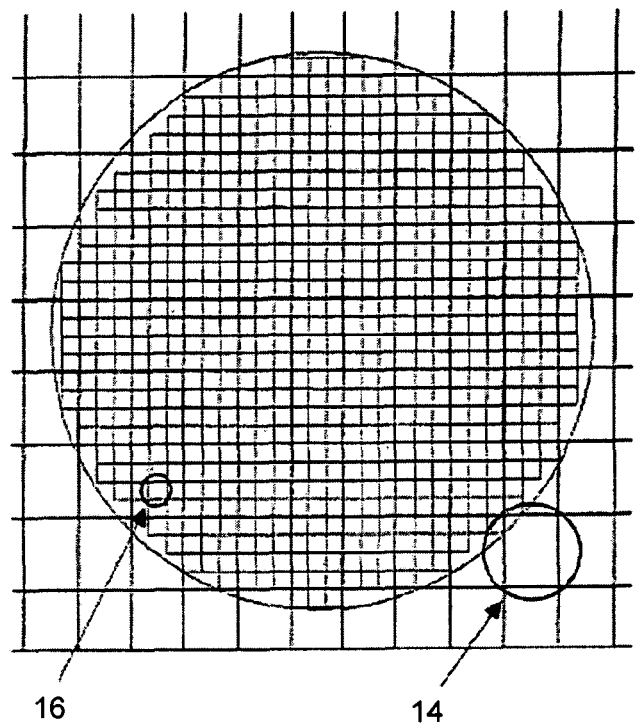

FIGS. 1A and 1B show, respectively, prior art single die reticle (exposure field 10 contains one unique die 12) and prior art multi-die reticle (array of multiple rows and columns of nominally identical die where exposure field 14 contains multiple die 16) wafer layouts and indicate their exposure field and die boundary dimensions. After photoresist patterning, inspection is preferably, but need not be, performed after etching on the SiON/oxide base film stack and stripping the photoresist. Inspecting an etched pattern usually yields a more sensitive inspection.

The exposure layout of the test wafer entails creating by a step and repeat exposure process an array of exposure field regions arranged in rows and columns. A lithographic parameter such as an illumination operating variable is modulated by rows but in only certain columns. Adjacent columns modulated by the operating variable are separated by at least one column not modulated by the operating variable. A typical and preferred operating variable is illumination focus.

Figure 2:
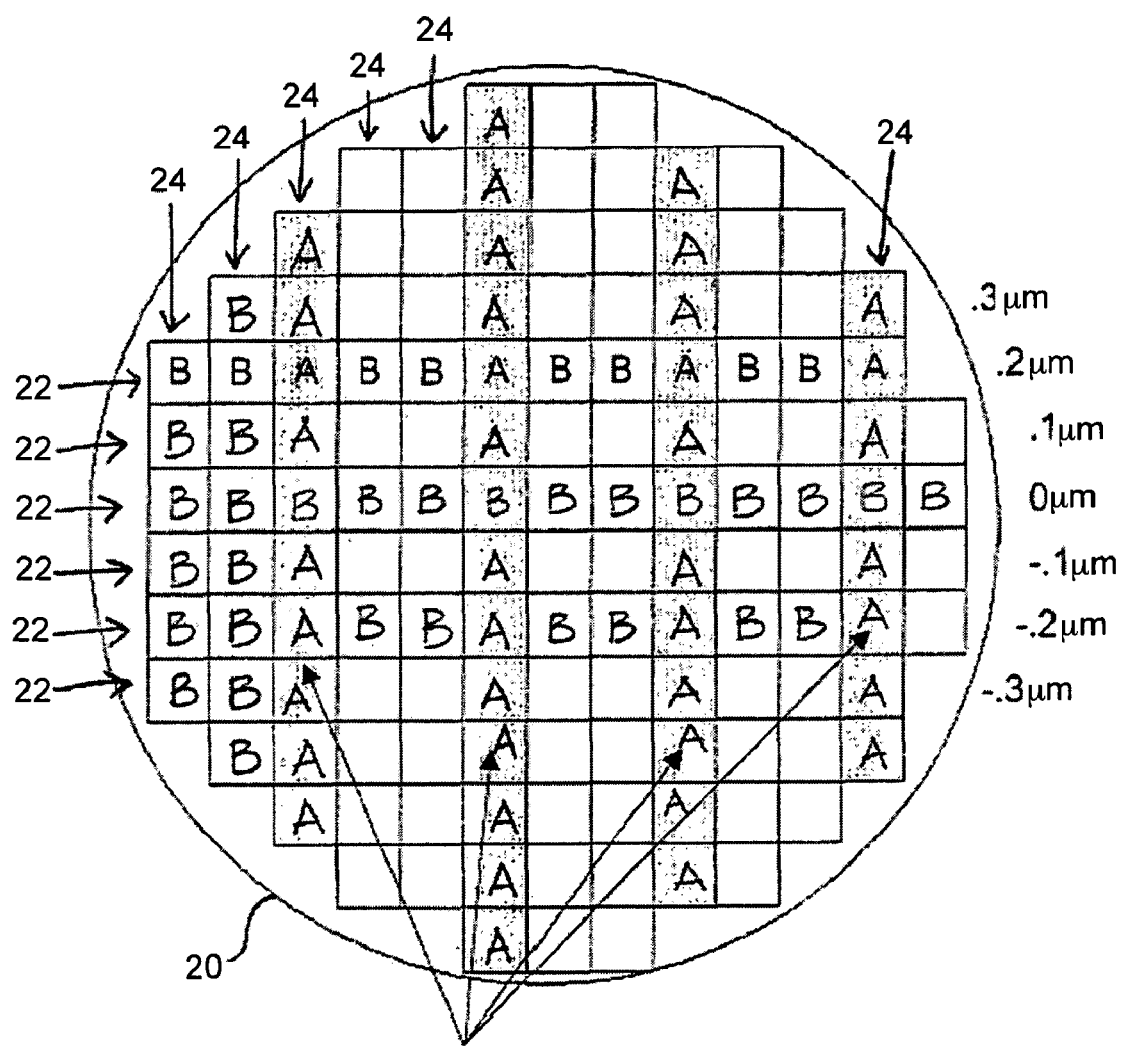
FIG. 2 is a schematic diagram of a wafer, with its surface subdivided into columns representing a "BBA" exposure field layout.

FIG. 2 shows an exposure layout for an exemplary 300 mm test wafer 20 in which illumination focus is progressively modulated in 0.1 μm increments of defocus in rows 22 positioned either direction away from a constant focus, constant exposure center row (0 μm). Four sets of three columns 24 each include two leading "B" columns of constant focus and constant exposure and one trailing "A" column of the focus condition corresponding to the row with which the "A" column intersects. (For purposes of visual clarity, only some of the exposure field regions are marked with "A" or "B.") The three-column set layout affords double detection of events and subsequent arbitration of die where an event is located.

Because the three-column set includes two "B" column dies, there is double detection of good features. A defect inspection tool can determine a difference between a column "A" die and either of the column "B" dies and thereby isolate defects, particularly transient defects. Skilled persons will appreciate that the exposure layout of FIG. 2 can be used on 200 mm wafers as well.

Figure 3:
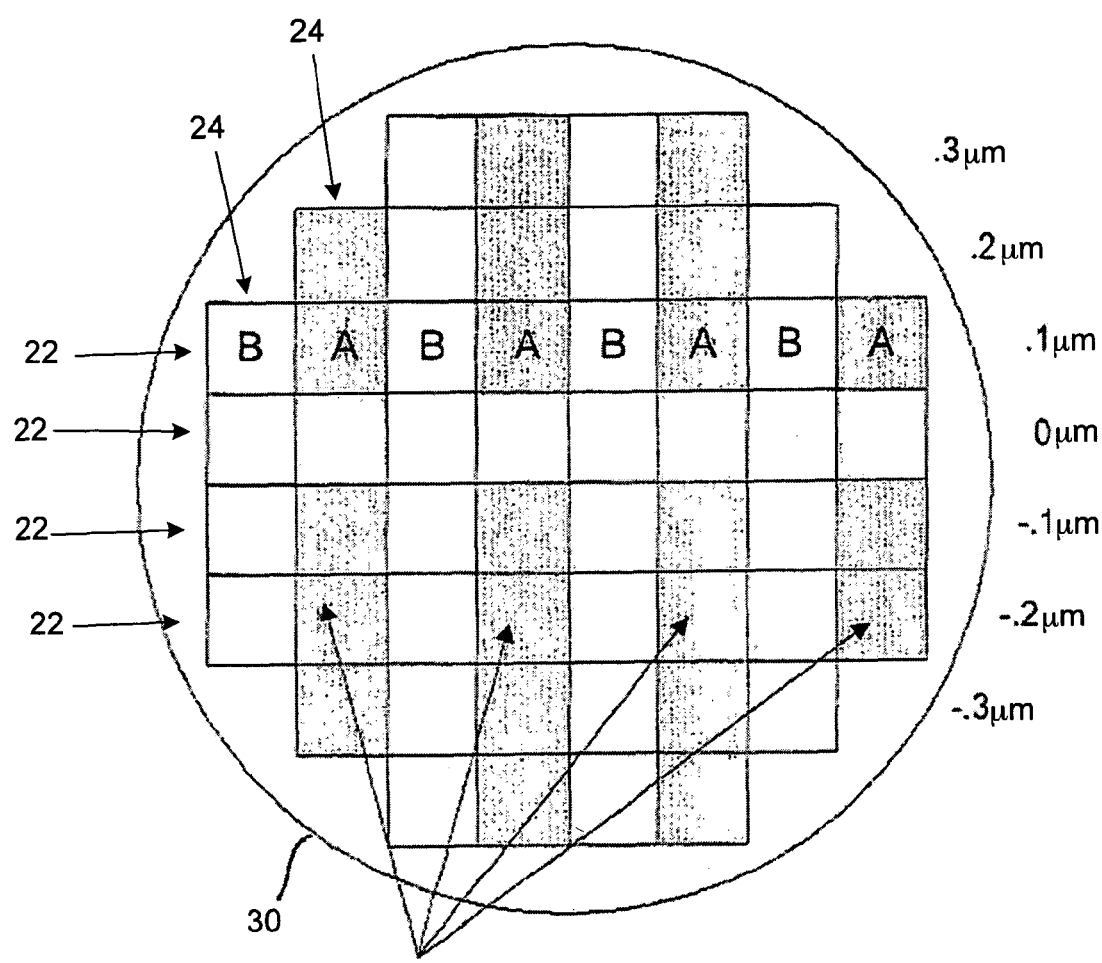
FIG. 3 is a schematic diagram of a wafer, with its surface subdivided into columns representing a "BA" exposure field layout.

FIG. 3 is an exposure layout shown for an exemplary 200 mm test wafer 30 in which focus is progressively modulated as in the 300 mm test wafer of FIG. 2, but with one exception. The exception is that there are four sets of two columns 24 alternating between a leading "B" column of constant focus, constant exposure and a trailing "A" column of the focus condition corresponding to the row 22 with which the "A" column intersects. The two-column set layout affords single detection of events with possible incorrect event location.

Skilled persons will appreciate that the process window qualification procedure may also be adapted for other lithographic parameters, such as optimizing partial coherence (sigma), numerical aperture (NA), and various illumination modes. Focus is a preferred illumination operating variable because it is the parameter most likely to vary daily from tool to tool. Optimizing other lithographic parameters will depend on the ability of the exposure tool to actively modulate the desired parameter for different exposures. Examples of design of experiment work that may be valuable to a lithography engineer include optimizing a sigma setting that balances tradeoffs between isolated contacts or vias and dense contacts or vias, optimizing the numerical aperture setting to allow maximum depth of field while retaining an acceptable process window, and choosing an illuminator that yields maximum process latitude for the pattern type being printed.

Figure 6:
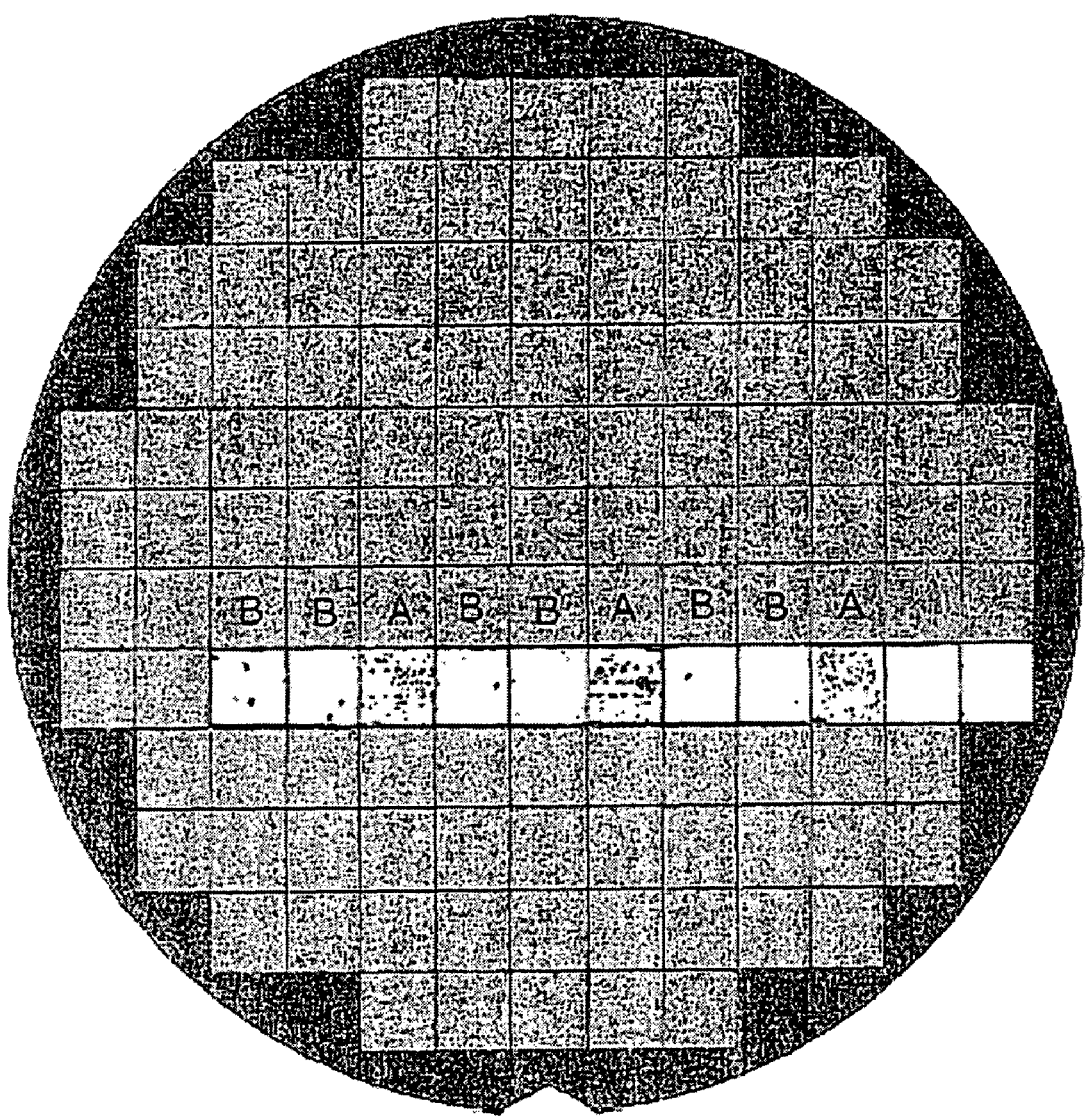
FIG. 6 is a diagram showing the defect event counts in the exposure field regions of the −0.2 μm defocus row of the test wafer of FIG. 5, from which exposure field regions hard repetitive defects have been removed.

FIGS. 4-12 illustrate the steps of sorting pattern anomalies from a test wafer in accordance with the invention. FIG. 4A shows a focus-modulated wafer 40 printed with a reticle that is to be qualified according to a "BBA" column pattern of a type shown in FIG. 2. Modulating the focus amplifies the impact of RET design rule errors. FIG. 4B is an enlarged view of portions of two rows including six columns of exposure field regions to show a preferred scan direction for inspecting the "BBA" column pattern. FIG. 5 is a diagram of a defect map 50 of a scanned test wafer exhibiting increasing defect counts of exposure field regions in rows representing increasing amounts of defocus in 0.1 µm increments relative to a zero defocus row. Defect map 50 of the wafer can contain thousands of defects, including a combination of random defects and repeating defects. FIG. 6 shows the defect event counts in the exposure field regions of the −0.2 µm defocus row of defect map 50 of FIG. 5. The "A" column exposure regions exhibit greater numbers of defect event counts than those exhibited in the "B" column exposure regions, from which "A" and "B" column exposure regions hard repetitive defects have been removed.

Figure 7:
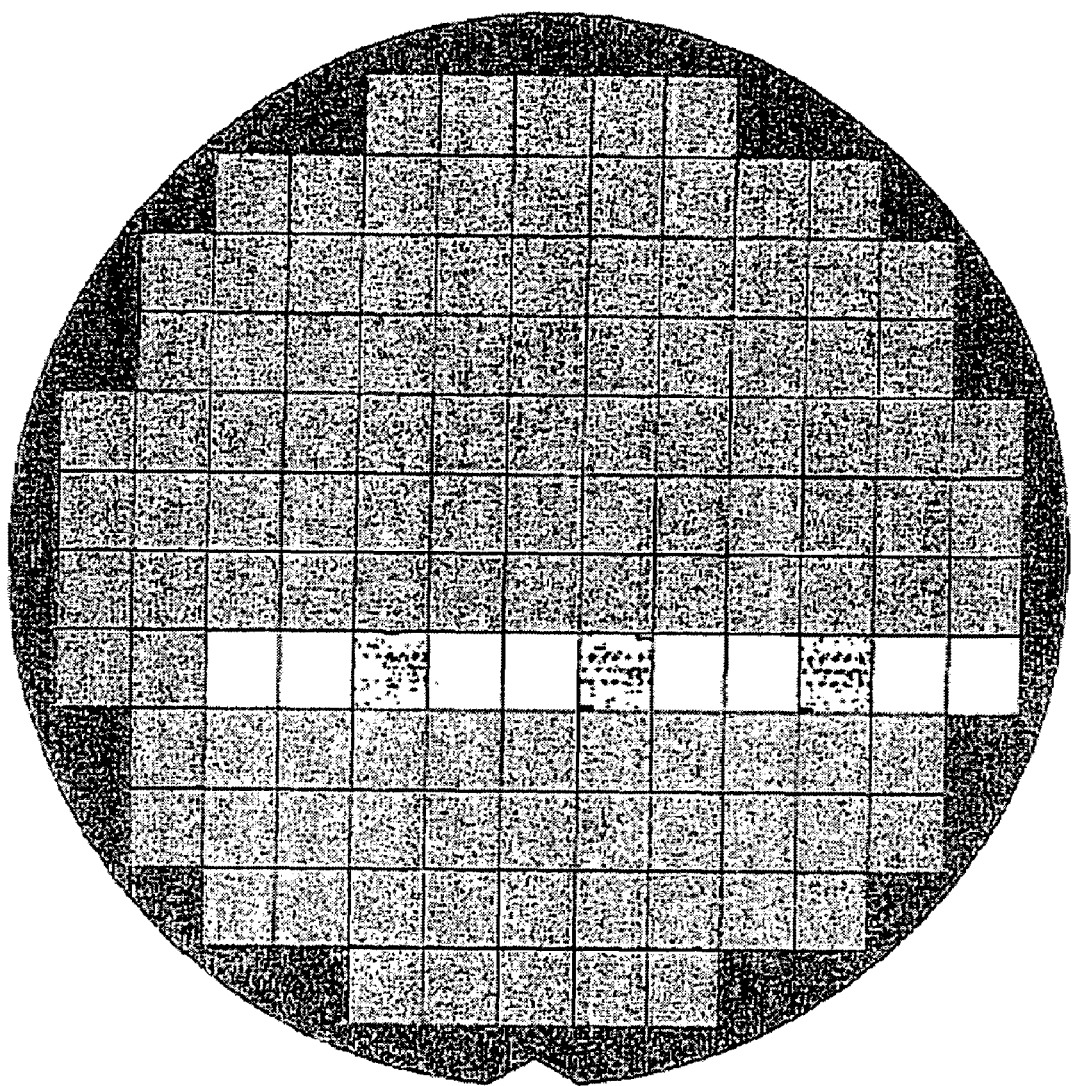
FIG. 7 is a diagram showing the isolation of defect event counts in the defect data files of the "A" columns of FIG. 6.
Figure 8:
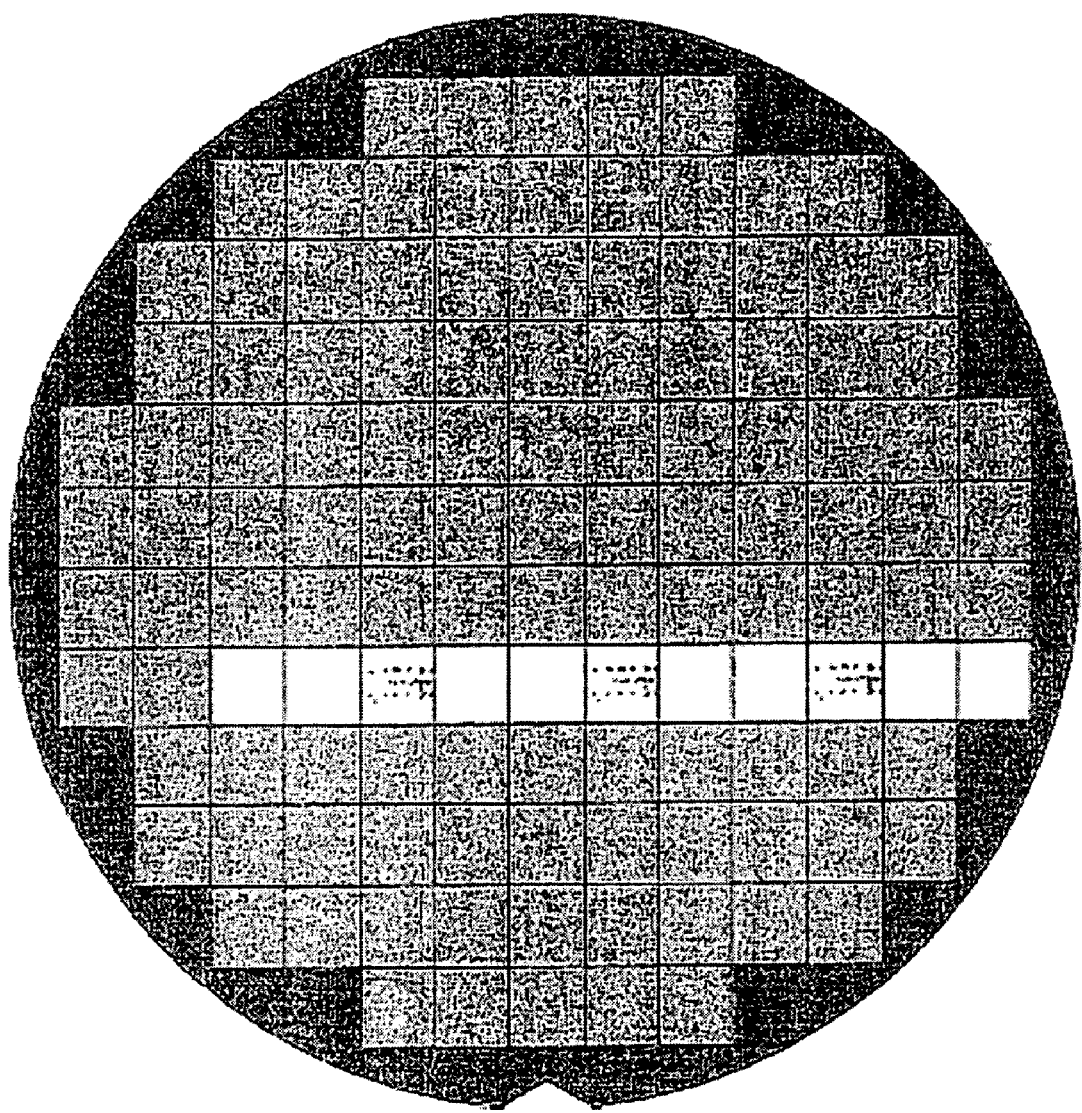
FIG. 8 is a diagram showing the isolation of transient repeater defects present in a stack of the defect data files of the three "A" column exposure field regions of FIG. 7.
Figure 9:
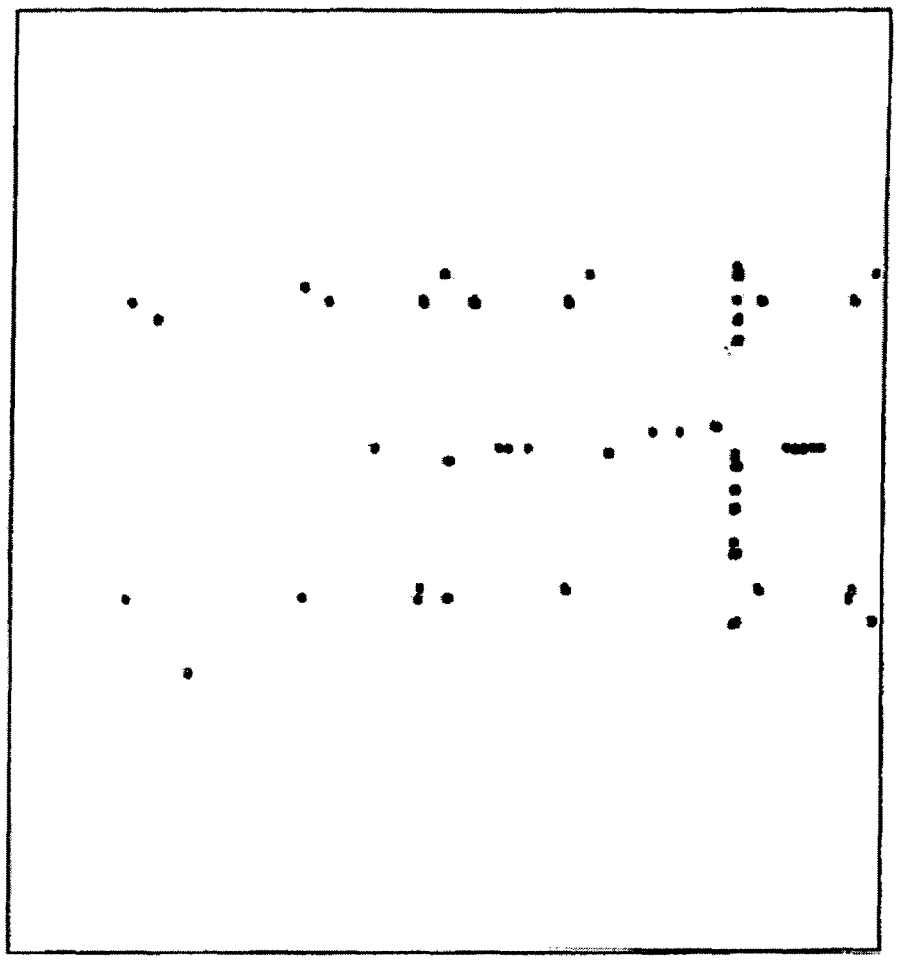
FIG. 9 is an enlarged diagram of the stack of defect data files in the "A" column exposure field regions of FIG. 8.

FIG. 7 shows the isolation of defect event counts in the defect data files of the "A" column exposure field regions of the defect map of FIG. 6. FIG. 8 shows the isolation of transient repeater defects present in a stack of the defect data files of the three "A" column exposure field regions of the test wafer of FIG. 7. This isolation is accomplished by advanced repeating defect algorithms, such as those implemented in KLArity® Defect inspection software available from KLA-Tencor Corporation. FIG. 9 is an enlarged view of the stack of the defect data files of the transient repeater defects in the "A" column exposure field regions of FIG. 8. The defect events shown in FIG. 9 appear on all of the "A" exposure field regions, so any of the "A" regions in the −0.2 µm defocus row may be used to view the defects.

The above-described defect or pattern anomaly isolation process is carried out for the reference (0 µm defocus) row and each of the defocus rows of the process window qualification test wafer, not just the −0.2 µm defocus row described above. Exposure pattern or die stacking performed for each row reduces to several hundred the number of repeating pattern anomalies. Certain of these repeating pattern anomalies are not of interest because they reside in non-critical areas or represent uniform critical dimension variations caused by the focus modulation. After the transient repeater defects have been sorted, the test wafer exposure fields are analyzed to identify the critical repeating pattern anomalies and those associated with RET design rule violations. The objective is to send only a few repeating pattern anomalies to the Critical Dimension Scanning Electron Microscope (CD SEM) for further analysis. Coordinates for further analysis with use of a CD SEM can be recorded automatically for further CD SEM analysis using data obtained in accordance with the processes described herein. Data for CD SEM review can be further selected based on position within the die and criticality as established by the design file (GDS2, GDS2 derivative, or equivalent data type).

Figure 10:
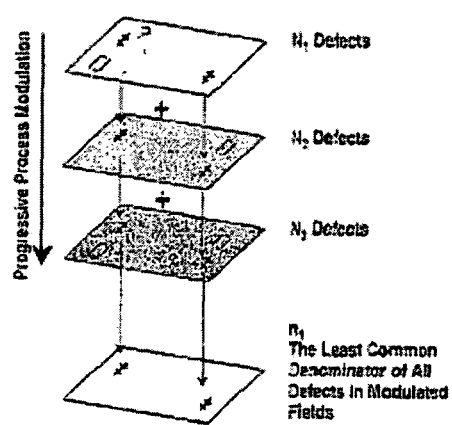
FIG. 10 is a diagram that is useful in explaining the analysis of identifying critical pattern anomalies.

FIG. 10 is a diagram that illustrates the analytical approach used in identifying critical pattern anomalies. The method of analysis enables qualifying single die reticles and detecting design pattern defects. The pattern anomaly analysis can be summarized as follows. FIG. 10 shows three levels $N_1$, $N_2$, and $N_3$ of one of the "A" column exposure field regions of a die within a 0.3 µm defocus range composed of three 0.1 µm defocus increments. Each of $N_1$, $N_2$, and $N_3$ represents a data file of positions where defects were found upon completion of the subtraction and arbitration processes described above. FIG. 8 illustrates the database that is the result of the arbitration process illustrated by FIG. 7. The exposure field regions of each "A" column are stacked within the range of defocus increments to determine the locations of design pattern anomalies for increasing amounts of defocus relative to the reference die row of zero defocus. This is accomplished by taking and comparing for a column the differences between different pairs of data files corresponding to exposure field regions located on either side of the reference row. Skilled persons will appreciate that a reference need not be a zero defocus value but could be a value that is appropriate for the lithographic operating variable selected.

FIG. 10 shows that the difference between the reference row and row $N_1$ (+0.1 µm defocus) produces anomalies at four locations; the difference between the reference row and row $N_2$ (+0.2 µm defocus) produces anomalies at three locations, two of which anomalies are common to anomalies in level $N_1$; and the difference between the reference row and row $N_3$ (+0.3 µm defocus) produces anomalies at four locations, three of which anomalies are common to anomalies in level $N_2$ and one of which is common to an anomaly in level $N_1$. FIG. 10 shows a level $n_1$, which represents the least common denominator of all defects in the focus modulated exposure field regions. The defects shown in level $n_1$ represent the most marginal, but are not necessarily the most critical, pattern anomalies. Stacking the difference values of the various defocus levels gives an indication of the weakest features, which include those common to all modulated exposure field regions and those that appear in the level $N_1$ (lowest defocus) modulated exposure field region. The number of occurrences and location of a design pattern anomaly contribute to its critical status.

The "A" column repetitive anomalies that offer the smallest process window are the most important ones. The "A" column repetitive anomalies that appear in row $N_1$ represent, therefore, the weakest features. Selecting the "A" column repetitive anomalies that are common to all modulated fields identifies these weakest features. Reviewing and manually classifying the weakest features indicates the locations of the weaker geometries in the design pattern layout. Weakest features can also be analyzed as described in International Publication No. WO 00/36525 by Glasser et al., published Jun. 22, 2000. Aligning the file data of isolated defects relative to the design file can be accomplished in a manner described in pending U.S. patent application Ser. No. 10/029,521, filed Dec. 21, 2001.

Figure 11:
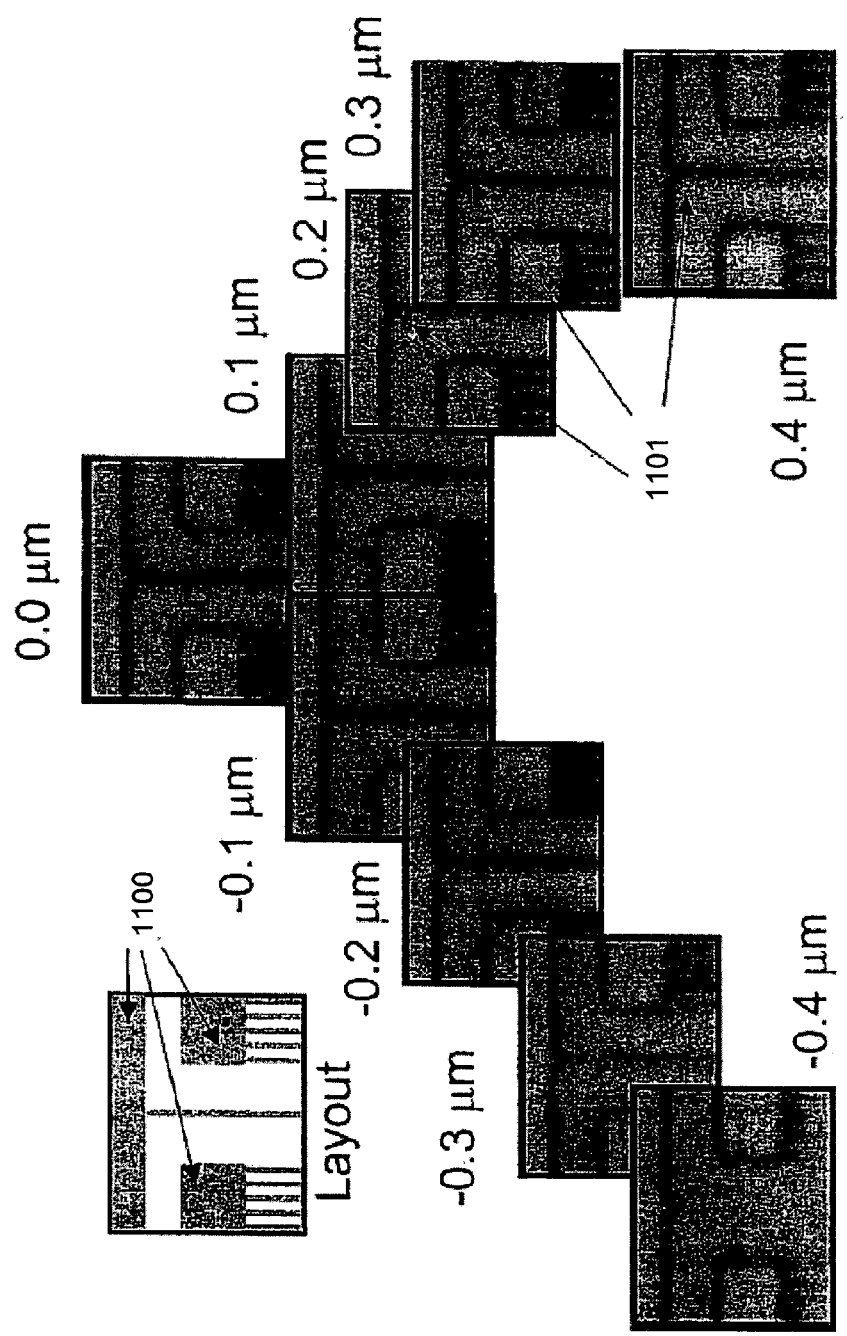
FIG. 11 is a series of optical images showing for a particular location in an exposure field the effects of 0.1 μm defocus increments in a ±0.4 μm defocus range.

FIG. 11 shows a series of optical images of the same location in an exposure field region for each of 0.1 μm defocus increments in a ±0.4 μm defocus range. FIG. 11 also shows the design pattern layout including polysilicon areas 1100 to which the images nominally correspond. Analysis of FIG. 11 reveals progressive line thinning 1101 for increasing defocus increments from zero defocus to +0.4 μm and loss of feature altogether for increasing defocus increments from zero defocus to −0.4 μm.

Figure 12:
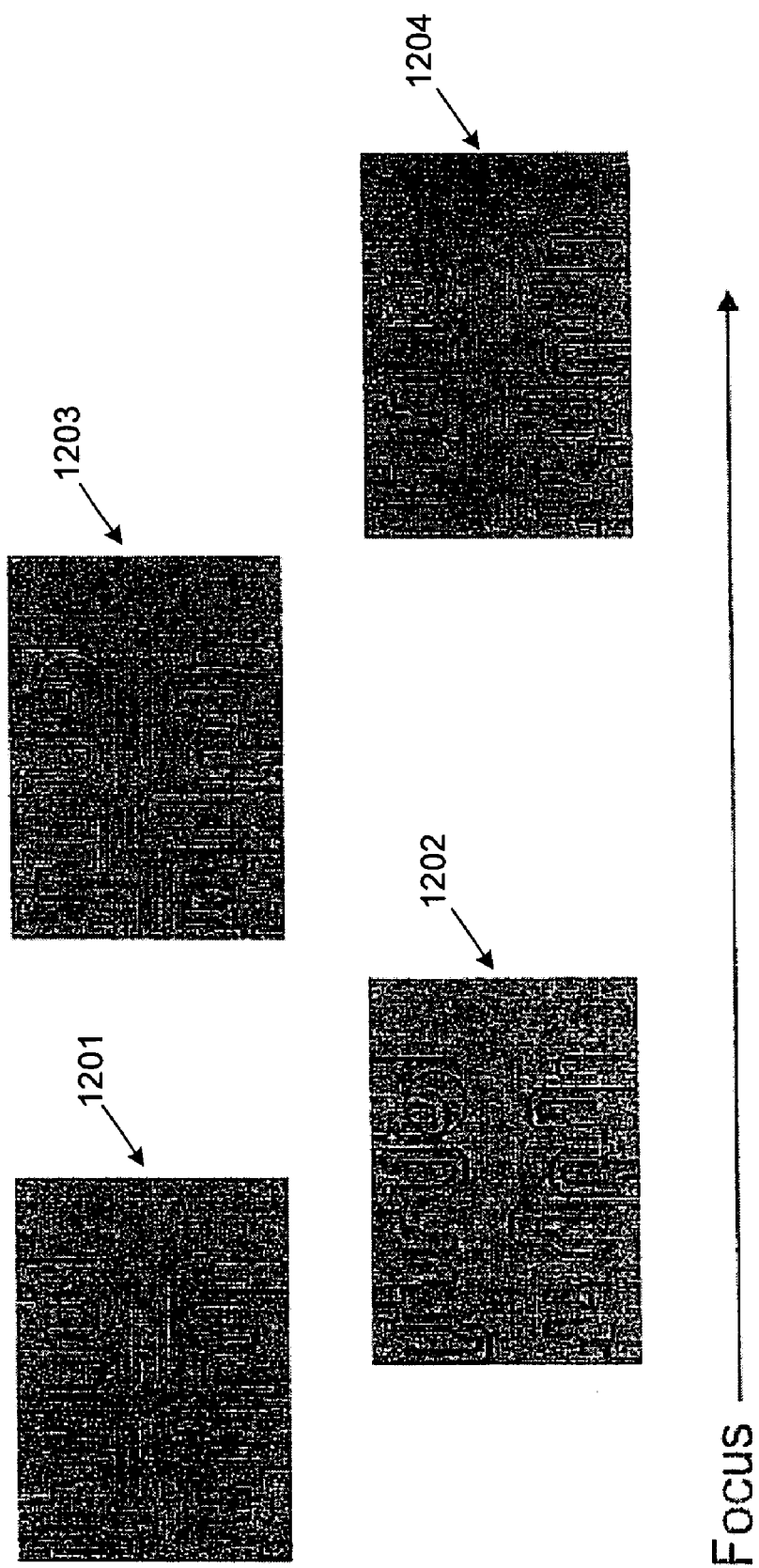
FIG. 12 is a series of optical images of a polysilicon wafer pattern progressively losing line fidelity for increasing amounts of illumination defocus.

FIG. 12 shows a series of optical images of a polysilicon wafer pattern progressively losing line pattern fidelity of an encircled area for increasing amounts of illumination defocus. Leftmost image 1201 represents a best focus condition, and rightmost image 1204 represents a defocus condition sufficient to produce a break in the line pattern. Images 1202 and 1203 represent images produced at defocus conditions between best focus and the focus condition of image 1204.

The above described embodiment entails exposing a test wafer to multiple reticle pattern images formed by different values of focus of light illuminating the reticle. The method has, however, general applicability in qualifying a pattern, patterning process, or patterning apparatus used in the fabrication of microlithographic patterns for producing microelectronic devices.

For example, the process of comparing images formed by different values of an illumination operating variable as described with reference to FIGS. 6-12 can be carried out on stored image data acquired by practice of AIMS techniques, DRC techniques, or optical rule check (ORC) techniques, which are a variation of the DRC techniques. The image data can represent a design pattern of a mask, reticle, or other patterned specimen. The AIMS technique and DRC technique entail storing data corresponding to, respectively, aerial images and computed or simulated images of the design pattern for each of the multiple values of an illumination operating variable. Discussions regarding use of the AIMS and DRC techniques can be found in U.S. Pat. No. 6,268,093 to Kenan et al. and U.S. Pat. No. 6,373,975 to Bula et al., respectively. The disclosures of those patents are hereby incorporated by reference in their entireties, and the methods described herein could be used to enhance the processes and apparatus set forth in those disclosures. Examples of evaluating a reticle or mask using simulated images of the reticle at different process parameters are illustrated in a commonly assigned copending application by Howard et al. having U.S. Ser. No. 60/451,707, filed Mar. 4, 2003, which is incorporated by reference as if fully set forth herein and for all purposes. The methods described herein may include any of the steps or embodiments described by Howard et al.

Figure 13:
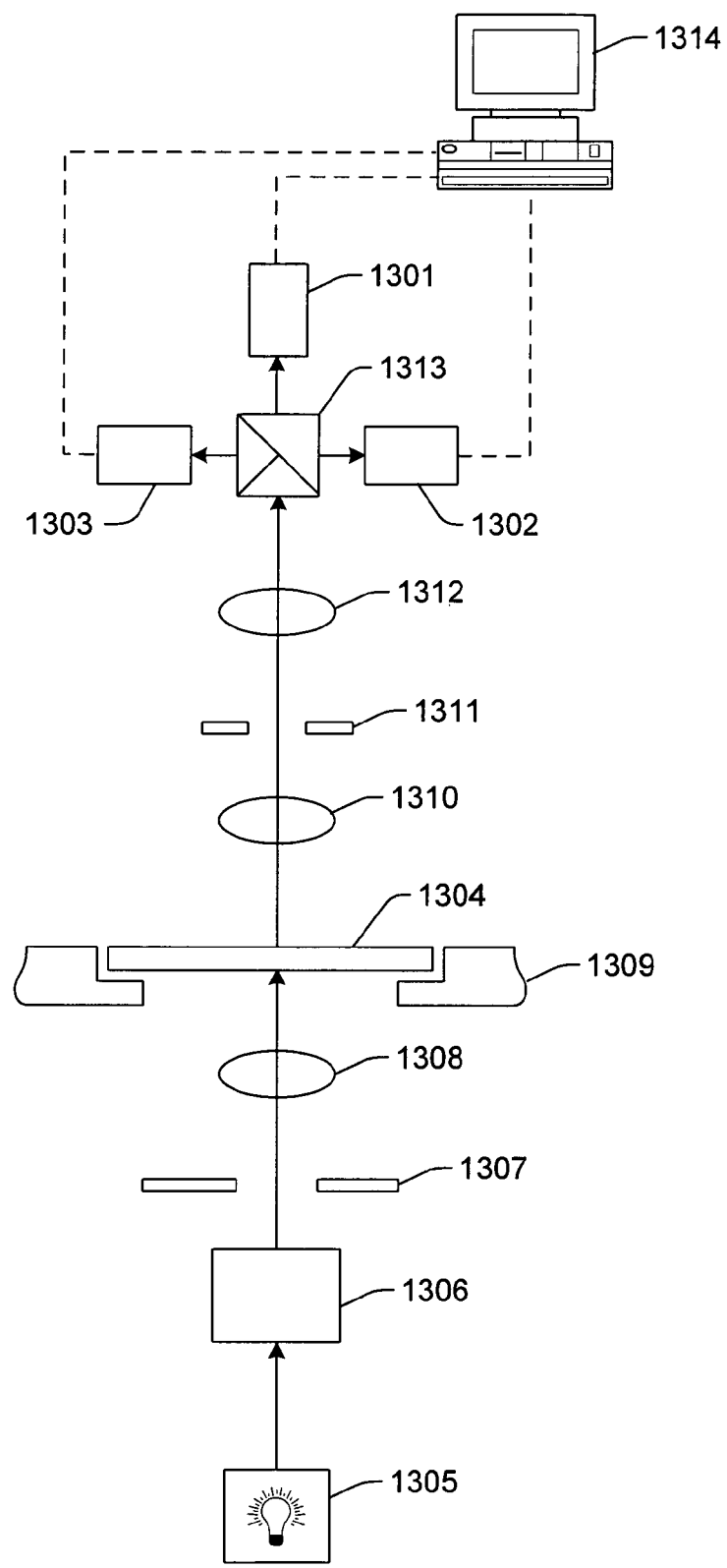
FIG. 13 is schematic diagram of an apparatus that can be used in connection with an AIMS embodiment of the invention.

One possible manner of implementing the methods described herein using an AIMS technique may be better understood by reference to FIG. 13. In FIG. 13, a system is shown having three detectors, i.e., detectors 1301, 1302 and 1303. Each of these detectors may preferably be set at a different focal position. For example, detector 1301 could be at zero defocus, detector 1302 could be at +0.2 defocus, and detector 1303 could be at minus 0.2 defocus. Of course, these levels of defocus are only examples. Any suitable range of levels of defocus could be used, and such levels would be optimized empirically. It is not necessary to use a detector having zero defocus, for example, and all of the detectors could be set at varying levels of positive defocus, or at mixed levels of positive and negative defocus.

Sample 1304 is preferably a mask or reticle. As sample 1304 is exposed to illumination source 1305, an aerial image is detected at the three detectors. Because of their different focal positions, the aerial images at each detector will have different levels of defocus. Images having varying levels of defocus may be compared and analyzed using any of the techniques previously set forth herein. In a preferred embodiment, signals taken from a first detector, such as detector 1301, are compared to signals taken from a second detector, such as detector 1302, continuously as sample 1304 is inspected. This is only one example, of course, any pairs of detectors could be compared. Alternatively, comparisons could be made between detectors and mathematical combinations of other detectors (such as a pixel by pixel average between a pair of detectors, or a difference between another pair of detectors). Preferably, the levels of defocus and/or the types of comparisons between the signals from the various detectors (or combinations thereof) are selected to provide the user with information regarding RET defects and the appearance of such defects across a process window.

In the embodiment shown in FIG. 13, it is possible to simultaneously perform a conventional inspection and a process window qualification. The purpose and methodology of the process window qualification (to find RET defects and the like) has already been described herein, and is further described hereinafter. The purpose of the conventional inspection is to find other types of defects, such as defects resulting from reticle manufacturing errors and/or from contaminants on the reticle. A method of such a conventional inspection is described in U.S. Pat. No. 6,268,093 to Kenan et al., which is mentioned above and incorporated by reference therein. Other suitable methods of performing such inspections are described in more detail in a commonly assigned copending application by Stokowski et al. having U.S. Ser. No. 60/418,994, filed Oct. 15, 2002, and incorporated by reference herein in its entirety and for all purposes. Such suitable methods include, without limitation, a die-to-database inspection in which the reticle is inspected by comparison against a rendered database from which the reticle was created.

In a preferred embodiment, the conventional inspection is done by comparing signals from the same detector taken at nominally identical portions of different dies. This inspection process works well for multi-die reticles. The process window qualification is performed substantially simultaneously, and may be achieved as already described herein by comparing images at varying levels of defocus for each die. So the conventional inspection might be achieved by comparing images from a first die on sample 1304 to images of a second die on sample 1304, wherein each image is detected using detector 1301. At substantially the same time as the images of each such die are collected for purposes of the conventional inspection, for each such die an image from detector 1301 and/or detector 1302 or detector 1303, is also compared to an image of that same die taken at a different focal position (for example from another of detectors 1301, 1302 and/or 1303, or any mathematical combination thereon). Thus, the conventional inspection and process window qualification may be performed substantially simultaneously.

If desired, the processing of the data from the conventional inspection and from the process window qualification could be performed on the same computer by using parallel processing. A suitable architecture and methodology are described in more detail in a commonly assigned copending application by Goldberg et al. having U.S. Ser. No. 09/449, 022, filed Nov. 24, 1999, and incorporated by reference herein in its entirety and for all purposes.

In yet another embodiment of the invention, and in accordance with the above description of the example shown in FIG. 13, a single die reticle could be provided as sample 1304, and only a process window qualification may be performed using the apparatus shown in FIG. 13. Such a technique may be desirable for all types of reticles, and may be particularly desirable for single die reticles. This is because the apparatus shown in FIG. 13 is in many ways inferior to other types of inspection systems, such as the 3XX and 5XX series commercially available from KLA-Tencor Corp of San Jose, Calif. Thus, it may be desirable to find conventional defects using the KLA-Tencor tools, and then inspect the same reticle again in an aerial image mode to locate RET defects by varying the process window. As mentioned above, this may be particularly desirable where sample 1304 is a single die reticle. This avoids the need to render the design database in a mode suitable for comparison against the aerial image. Instead, the aerial image is used only for purposes of finding RET defects, and the conventional inspection is done using a more accurate tool which can directly compare the actual image of the reticle to the rendered database (including the OPC features present therein).

Of course, if a suitably rendered database is available for comparison against the AIMS image (rendered using the techniques described, for example, in the application by Stokowski et al., as mentioned above), a die-to-database inspection could be done using an AIMS tool such as that shown in FIG. 13. In such a case, it is possible to also do the inspection for RET defects by using a comparison against the rendered database. For example, the conventional inspection could be performed by comparing images from a detector at zero defocus to images rendered from the database, also at zero defocus. The RET defects could then be found by comparing the images from one or more detectors, at varying levels of defocus, against the rendered database at zero defocus. Or the database could also be, through simulation, rendered in a manner that is consistent with a given level of defocus. In either situation, the methods described herein could be applied to find RET defects.

The present invention is not limited to just finding RET defects by varying the level of defocus. As noted above, varying sigma and/or the numerical aperture (NA) of the system are also relevant to the process window. Varying these parameters can, therefore, be used to find RET defects. One method of achieving this is to take an image obtained using an inspection under a first set of conditions (i.e., a first set of sigma, NA and defocus), then take an image of the same reticle under a second set of conditions (i.e, varying one or more of the NA, sigma and defocus), and compare the resulting images. Such a method can be implemented, using an apparatus such as that shown in FIG. 13, simply by storing data taken from a first inspection of a reticle under a first set of conditions, varying parameters such as sigma, NA and/or defocus on the apparatus, and then re-inspecting the same reticle with the new parameter settings in place. The images are aligned prior to comparison. The stored data could be taken from inspection of an entire reticle (and stored on an optical disk or other media having suitable storage space), or could be taken across just a portion of the reticle (such as one or more swaths). If only a portion of the reticle inspection data is stored, storage might be appropriately handled in a memory buffer or the like. In some embodiments, the stored data may represent a "reference reticle field," or an aerial image of the reticle that would be produced at the best known process conditions, which may be stored such that it can be later used for transient repeating defect detection and/or non-transient defect detection.

In another embodiment, stored data could be taken from inspection of an entire die or just a portion of the die. In one such embodiment, the die or the portion of the die may correspond to a design pattern that is formed on the wafer using a reference member value of a set of lithographic values, which in some embodiments may be the best known conditions. In this manner, the stored data may represent a "reference die." In alternative embodiments, the stored data may be a simulated image. For example, the simulated image may be an image that would be printed on the wafer at the reference member value. In one embodiment, the simulated image may be generated from reticle design data. The reticle design data may be altered based on the reference member value to generate a simulated aerial image of the reticle. In a different embodiment, the simulated image may be generated from an aerial image of the reticle that is acquired by reticle inspection. The simulated aerial image or the acquired aerial image may be altered using a resist model to generate an image of the reticle that would be printed on the wafer at the reference member value.

The stored data may be compared to other die or portions of die on the wafer to determine a presence of defects on the wafer. In some embodiments, the die that are compared to the stored data may be printed at different conditions (i.e., not the reference member value). As such, the stored data may be used to determine a presence of transient repeating defects in the die or the portions of the die on the wafer. Alternatively, the die that are compared to the stored data may be printed at the same conditions as the stored data (i.e., the reference member value). Therefore, the stored data may be used to determine a presence of non-transient defects in the die or the portions of the die on the wafer.

As shown in FIG. 13, the system may include a number of other components including, but not limited to, homogenizer 1306, aperture 1307, condenser lens 1308, stage 1309, objective lens 1310, aperture 1311, lens 1312, beamsplitter 1313, and processor or computer 1314. The components may be configured as described in more detail in a commonly assigned copending application by Stokowski et al. having U.S. Ser. No. 60/418,994, filed Oct. 15, 2002. These components may be altered to provide varying parameters such as sigma, NA, the type of illumination, and the shape of the beam. For example, aperture 1307 may be altered to change sigma, the NA, the type of illumination, and the shape of the beam.

Figure 14A:
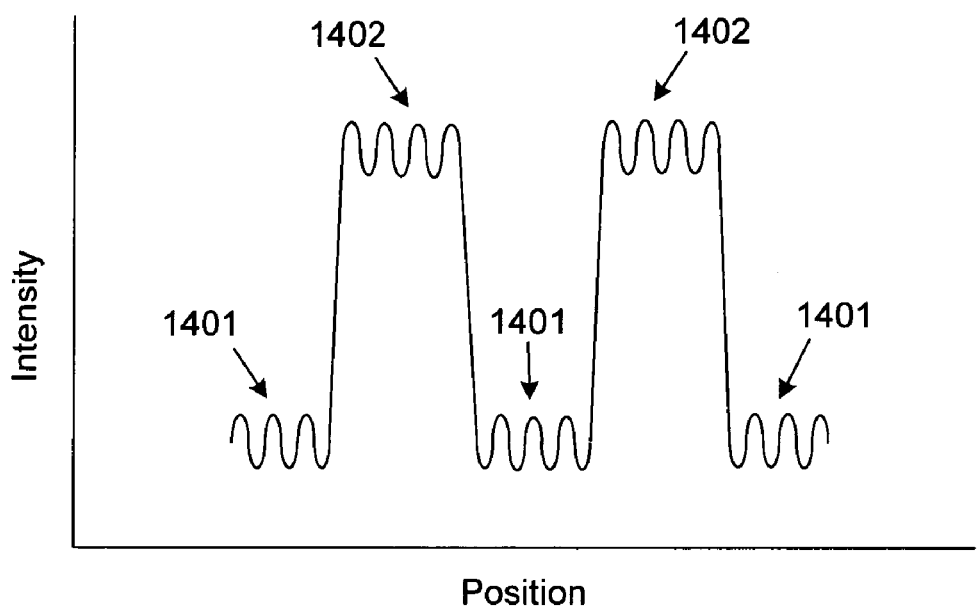
FIGS. 14A and 14B illustrate a method of processing detected signals in accordance with an embodiment of the invention.
Figure 14B:
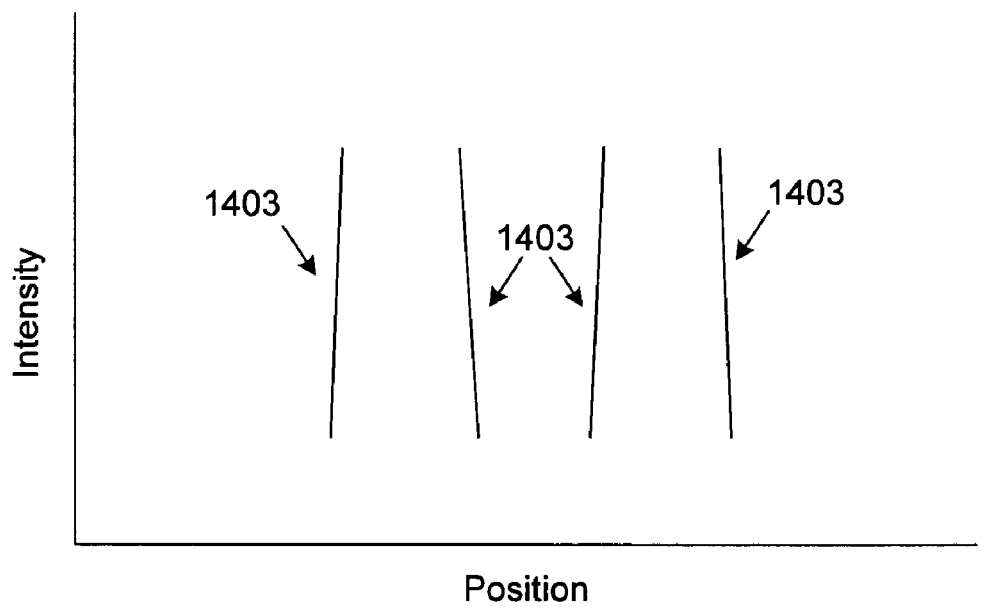

In a preferred embodiment, rather than directly comparing raw data from each detector (and/or from a rendered database), it may desirable to preprocess the data prior to comparison. One such preprocessing technique is illustrated in FIGS. 14A and 14B. FIG. 14A shows the intensity profile of light transmitted through a reticle. The areas of very low intensity 1401 may correspond to opaque regions (like chrome) and the regions of high intensity 1402 may correspond to transparent regions (like quartz). In the method of FIG. 14B, intensity data across the image is filtered (using a bandpass filter, for example) to remove all but the midrange intensity values 1403. These midrange values are associated with the edges of lines or other features printed using the reticle. Thus, errors associated with these values tend to be significant, and may relate to CD variation or other problems caused by RET defects. By contrast, the high and low range intensity values are often associated with lithographically insignificant variations. If one were to compare the total signals, including the high and/or low range intensity values for images taken by different detectors (or under different conditions, such as varied sigma or NA), the resulting comparison would tend to flag false defects because of the variations in these high and low intensity values. Thus, by removing the high and low intensity values before comparison, false defects are not flagged. Of course, this is only one example of a suitable preprocessing technique, and others could be envisioned. For example, a Gaussian filter could be applied to the signal. Or the signal could be differentiated one or more times, and those regions having first and second derivatives within appropriate ranges of values could be saved while others could be discarded. This technique could be used in conjunction with the example shown in FIG. 13, or could be used in connection with the DRC comparisons described herein.

In another preferred embodiment, the data taken from inspection by any method described herein (e.g., inspection using aerial images, inspection of images printed on a wafer, inspection of simulated images in accordance with DRC techniques, etc.) may be used to flag regions of a reticle or wafer for review. The coordinates for such review could be stored by the inspection apparatus and passed to a review tool (or performed on a review tool integrated into the inspection apparatus). In one preferred embodiment, the review tool is an aerial image review tool of the type commercially available from Carl Zeiss, Inc., Germany. Potential RET defect locations on a reticle are identified, and the coordinates passed to the Zeiss tool. Each such potential defect (or a sample statistically selected from a group of such defects) is then reviewed at varying levels of defocus (or other optical conditions, such as sigma or NA) to further study the possible defect and its potential significance.

If multiple similar RET defects are found during an inspection, they could be binned according to any desired method. In a preferred embodiment, these defects are binned by the appearance of the region immediately surrounding the defect. It has been discovered by the inventors that RET defects tend to be associated with the immediately surrounding pattern, and binning them by their surrounding pattern can both facilitate determination of the root cause of such defects, as well as avoid time consuming repetitive review of substantially identical defects associated with substantially identical regions.

It is to be noted that the above methods that use aerial images may also be performed in a similar manner using simulated images (e.g., images acquired using DRC techniques or ORC techniques).

Further modifications and alternative embodiments of various aspects of the invention may be apparent to those skilled in the art in view of this description. For example, two different illumination operating variables (e.g., focus and exposure duration) could be printed on separate halves of a single test wafer to perform different qualifying experiments on the same wafer. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method, comprising:
   acquiring aerial images of a reticle containing a design pattern, wherein the aerial images are acquired for different values of a member of a set of lithographic variables, and wherein one of the different values represents a reference member value;
   inspecting the reticle for non-transient defects; and
   determining a presence of transient repeating defects on the reticle by subtracting non-transient defects from the aerial images and comparing at least one pair of the aerial images corresponding to at least two of the different values, wherein one of the at least two of the different values represents the reference member value, and wherein the transient repeating defects are defects that will print under only a portion of the different values.

2. The method of claim 1, wherein the member comprises illumination focus, exposure, degree of partial coherence, illumination mode, or numerical aperture.

3. The method of claim 1, wherein the reticle is a single die reticle or a multi-die reticle.

4. The method of claim 1, wherein the aerial images are acquired with different detectors having the different values.

5. The method of claim 1, wherein said inspecting the reticle is performed using one of the aerial images, and wherein the non-transient defects comprise reticle manufacturing errors and contaminants.

6. The method of claim 1, wherein said inspecting comprises a die-to-database comparison or a die-to-die comparison.

7. The method of claim 1, further comprising prior to said determining, preprocessing the at least one pair of the aerial images to remove relatively high intensity values and relatively low intensity values from the at least one pair of the aerial images.

8. The method of claim 1, further comprising identifying regions of the reticle for review based on locations of the transient repeating defects.

9. The method of claim 8, wherein the review comprises aerial image review at varying levels of optical conditions.

10. The method of claim 1, wherein if more than one transient repeating defect is found on the reticle, the method further comprises binning the more than one transient repeating defect according to regions of the reticle proximate the more than one transient repeating defect.

11. The method of claim 1, further comprising determining a process window for a lithography process to be carried out using the reticle.

12. The method of claim 1, further comprising determining a critical status of the transient repeating defects.

13. The method of claim 1, wherein if more than one transient repeating defect is found on the reticle, the method further comprises binning the more than one transient repeating defect by appearance of regions of the reticle immediately surrounding the transient repeating defects.

14. The method of claim 1, wherein if more than one transient repeating defect is found on the reticle, the method further comprises binning the more than one transient repeating defect by patterns surrounding the transient repeating defects.

15. A method, comprising:
acquiring aerial images of a reticle containing a design pattern, wherein the aerial images are acquired for different values of a member of a set of lithographic variables;
inspecting the reticle for non-transient defects;
determining a presence of transient repeating defects on the reticle by subtracting the non-transient defects from the aerial images and comparing at least one pair of the aerial images corresponding to at least two of the different values to find areas on the reticle in which the transient repeating defects on the reticle are located, wherein the transient repeating defects are defects that will print under only a portion of the different values; and
determining which of the areas on the reticle where a lithography process using the reticle is most susceptible to failure based on results of said comparing.

16. The method of claim 15, wherein one of the different values represents a reference member value.

17. The method of claim 16, wherein the area that is most susceptible to failure comprises transient repeating detects that are common to the at least one pair of the aerial images not acquired at the reference member value and that are not common to the aerial image acquired at the reference member value.

18. A method, comprising:
inspecting a reticle containing a design pattern for non-transient defects;
acquiring aerial images of the reticle for different values of a member of a set of lithographic variables; and
determining a presence of transient repeating defects on the reticle by subtracting the non-transient defects from the aerial images and comparing at least one pair of the aerial images corresponding to at least two of the different values, wherein the transient repeating defects are defects that will print under only a portion of the different values.

19. The method of claim 18, wherein said inspecting and said acquiring are performed substantially simultaneously.

20. The method of claim 18, wherein said inspecting comprises aerial imaging of the reticle at a reference member value of the set of the lithographic variables.

21. The method of claim 18, wherein said inspecting is performed using a non-aerial imaging reticle inspection system.

22. The method of claim 18, wherein said inspecting comprises a die-to-database comparison or a die-to-die comparison.

23. The method of claim 18, further comprising determining a process window for a lithography process to be carried out using the reticle based on the transient repeating defects.

24. The method of claim 18, wherein the non-transient defects comprise reticle manufacturing errors or contaminants on the reticle.

* * * * *